United States Patent [19]
Nath et al.

[11] Patent Number: 5,101,260
[45] Date of Patent: Mar. 31, 1992

[54] MULTILAYER LIGHT SCATTERING PHOTOVOLTAIC BACK REFLECTOR AND METHOD OF MAKING SAME

[75] Inventors: Prem Nath, Rochester; John Call, Royal Oak; Kevin Hoffman, Sterling Heights; Timothy D. Laarman, Almont; Gary DiDio, Highland, all of Mich.

[73] Assignee: Energy Conversion Devices, Inc., Troy, Mich.

[21] Appl. No.: 609,040

[22] Filed: Nov. 5, 1990

Related U.S. Application Data

[63] Continuation of Ser. No. 345,936, May 1, 1989, abandoned.

[51] Int. Cl.⁵ .................. H01L 23/48; H01L 29/46; H01L 29/62; H01L 29/64
[52] U.S. Cl. ........................... 357/67; 357/30; 357/71; 357/62; 357/65
[58] Field of Search .............. 357/30, 67, 71, 62, 357/65

[56] References Cited

U.S. PATENT DOCUMENTS

| | | | |
|---|---|---|---|
| 3,772,768 | 11/1973 | Fischer et al. | 29/572 |
| 4,611,091 | 9/1986 | Choudary et al. | 136/260 |
| 4,773,944 | 9/1988 | Nath et al. | 136/249 |
| 4,775,425 | 10/1988 | Guha et al. | 136/249 |
| 4,816,082 | 3/1989 | Guha et al. | 136/249 |
| 4,902,081 | 2/1990 | Huffer | 350/1.7 |

FOREIGN PATENT DOCUMENTS

| | | |
|---|---|---|
| 50-32025 | 10/1975 | Japan . |
| 54146648 | 6/1981 | Japan . |
| 55-128110 | 3/1982 | Japan . |

Primary Examiner—Andrew J. James
Assistant Examiner—Stephen D. Meier
Attorney, Agent, or Firm—Marvin S. Siskind

[57] ABSTRACT

A multilayered, light-scattering back reflector for a photovoltaic device, said back reflector including a first relatively hard, textured layer atop a substrate and a second highly reflective layer conformally disposed atop the first layer. The back reflector may further include a third light scattering layer formed atop said second layer, said third layer adapted to further provide a barrier layer between the body of semiconductor material from which the photovoltaic device is formed and the multilayered back reflector.

12 Claims, 1 Drawing Sheet

MULTILAYER LIGHT SCATTERING PHOTOVOLTAIC BACK REFLECTOR AND METHOD OF MAKING SAME

This is a continuation of co-pending application Ser. No. 345,936, filed on May 1, 1989, now abandoned.

FIELD OF THE INVENTION

This invention relates generally to thin film semiconductor devices of the type which include a substrate, a light scattering back reflector upon which said substrate and a body of semiconductor material upon said back reflector. This invention more particularly relates to thin film semiconductor devices which include multi-layered light scattered back reflectors having at least a first textured layer, and a second highly reflective layer thereatop. The back reflector may further include a third layer disposed upon said reflective layer, said third layer adapted to enhance the scattering of reflected incident illumination. This invention further relates to methods of fabricating such multilayered back reflectors.

BACKGROUND OF THE INVENTION

Single crystal photovoltaic devices, especially silicon photovoltaic devices have been utilized for some time as sources of electrical power because they are inherently non-polluting, silent and consume no expendable natural resources in their operation. However, the utility of such devices is limited by problems associated with the manufacture thereof. More particularly, single crystal material are: (1) difficult to produce in sizes substantially larger than several inches in diameter; (2) thicker and heavier than their thin film counterparts; and (3) expensive and time consuming to fabricate.

Recently, considerable efforts have been made to develop processes for depositing large area amorphous semiconductor films, which films can be doped to form p-type and n-type materials for the production of p-i-n type photovoltaic devices substantially equivalent to those produced by their crystalline counterparts. It is to be noted that the term "amorphous" as used herein, includes all materials or alloys which have long range disorder, although they may have short or intermediate range order or even contain, at times, crystalline inclusions. Also, as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, optical gap and absorption constant occur.

It is of obvious commercial importance to be able to mass produce photovoltaic devices such as solar cells. However, with crystalline cells, mass production was limited to batch processing techniques by the inherent growth requirements of the crystals. Unlike crystalline silicon, amorphous silicon and germanium alloy material can be deposited in multiple layers over large area substrates to form semiconductor devices such as solar cells in a high volume, continuous processing system. Such continuous processing systems are disclosed in U.S. Pat. Nos. 4,400,409, for "A Method of Making P-Doped Silicon Films and Devices Made Therefrom"; 4,410,588, for "Continuous Amorphous Solar Cell Deposition And Isolation System And Method; 4,542,711, for "Continuous Systems For Depositing Amorphous Semiconductor Material"; 4,492,181 for "Method And Apparatus For Continuously Producing Tandem Amorphous Photovoltaic Cells"; and 4,485,125 for "Method And Apparatus For Continuously Producing Tandem Amorphous Photovoltaic Cells." As set forth in these patents, the disclosures of which are incorporated herein by reference, a substrate may be continuously advanced through a succession of deposition chambers, wherein each chamber is dedicated to the deposition of a specific layer of semiconductor material. For example, in making a solar cell of n-i-p type configuration, the first chamber is dedicated for depositing a layer of n-type amorphous silicon alloy, the second chamber is dedicated for depositing a layer of intrinsic amorphous silicon alloy material, and the third chamber is dedicated for depositing a layer of p-type amorphous silicon alloy material.

The layers of thin film semiconductor alloy material thus deposited in the vacuum envelope of the deposition apparatus may be utilized to form a photovoltaic device including one or more p-i-n cells, one or more n-i-p cells, a Schottky barrier, as well as photodiodes, phototransistors, other photosensors, memory arrays, display devices or the like. Additionally, by making multiple passes through the succession of deposition chambers, or by providing an additional array of deposition chambers, multiple stacked photovoltaic cells or other semiconductor devices of various configurations may be fabricated.

The concept of utilizing multiple stacked cells of differing band gaps to enhance photovoltaic device efficiency was created to more effectively collect various portions of the solar spectrum and to increase open circuit voltage (Voc). The tandem cell device (by definition) has two or more cells with the light directed serially through each cell. In the first cell, a large band gap material absorbs only the short wavelength light, while in subsequent cells smaller band gap material absorb the longer wavelengths of light which pass through the first cell. By substantially matching the generated currents from each cell, while the short circuit current thereof remains substantially constant, the overall open circuit voltage is the sum of the open circuit voltage of each cell.

Most photovoltaic device preferably also include a light reflecting back reflector for increasing the percentage of incident light reflected from the substrate back through the active semiconductor alloy material of the cells. It should be obvious that the use of a back reflector increases the amount of light which passes through the active semiconductor alloy material thus increasing the amount of incident light which is converted to electricity, and increasing the operational efficiency of the photovoltaic device. However, all layers, other than the layers of semiconductor material, deposited atop the light incident surface of the substrate must be transparent so as to pass a high percentage of incident light from the anti-reflective coating atop the photovoltaic cell to the highly reflective surface of the back reflector from which it is redirected through and absorbed by the semiconductor layers.

The back reflector may be formed atop the deposition surface of the substrate if an opaque substrate is employed. Of course, the back reflector may be either specular or diffuse. With either type of back reflector, light which has initially passed through the active body of semiconductor alloy material from which the photovoltaic device is fabricated, but which is absorbed on its initial pass, is redirected by the highly reflective material of the back reflector to pass, once again, through said active body of semiconductor alloy material. The additional pass results in increased photon absorption and charge carrier generation, thereby providing increased short circuit current. In the case of specular back reflectors, wherein the highly reflective material is conformally deposited over a smooth surface, the unused light is generally redirected for one additional pass through the active body of semiconductor alloy material of the device.

Diffuse back reflectors include a highly reflective material which is grown in a textured manner upon an underlying surface. Light incident upon said textured back reflector is scattered in addition to being redirected through the active body of semiconductor alloy material, thereby mandating that a portion of the redirected light travel at angles sufficient to cause said redirected light to be substantially confined within the photovoltaic device, i.e., achieve total internal reflection. This internal reflection provides for lengthened photon paths through the active semiconductor alloy material, thus increasing the operational efficiency of the photovoltaic device. Further, textured, diffuse back reflectors redirect light through the active semiconductor alloy material of the photovoltaic device at an angle; thus the active semiconductor alloy material appears thinner, thereby reducing charge carrier recombination, while still maintaining efficient charge carrier generation (improving short circuit current) and promoting charge carrier collection (improving the fill factor). Also, textured back reflectors contribute to textured overlying layers of semiconductor alloy material. Textured semiconductor alloy material has a larger boundary surface area, thus making the path a charge carrier must travel to collection shorter, and therefore reducing the likelihood of recombination in the active semiconductor alloy layer.

As should be apparent from the foregoing discussion, and since the purpose of a back reflector of a photoresponsive device is to redirect incident light for at least a second pass through the active body of semiconductor alloy material thereof, absorption of that incident light by the back reflector cannot be tolerated. Further, the material employed as the back reflector cannot interact with, or diffuse into, the overlying layers of semiconductor alloy material. Additionally, the back reflector material cannot add series resistance to the photovoltaic device, nor can it be too soft, since softness decreases yield, while causing short circuit junctions, and interlayer peeling. Accordingly, several different materials have been investigated for use as the back reflector is photovoltaic devices. Several are reviewed hereinbelow. For use as back reflectors, the most highly reflective material is silver which is characterized by an integrated reflectivity of about 94%. Aluminum is another highly reflective back reflector material commonly used in the fabrication of back reflectors. Aluminum has an integrated reflectivity of about 88%. Yet another highly reflective material which has been proposed for use as a back reflector is copper which is characterized by an integrated reflectivity of about 70%. The last of the most commonly employed reflective materials from which back reflectors are fabricated, is stainless steel having an integrated reflectivity of about 45%. While stainless steel is not nearly as reflective (and indeed, was not described as "highly" reflective) as aluminum, silver, and copper, it has been utilized as a substrate material and hence remains a possible candidate when economic factors are taken into consideration.

Previous attempts to employ aluminum as the highly reflective material of a back reflector for a photoresponsive device, which device included a body of amorphous silicon alloy semiconductor material have been unsuccessful because of the interdiffusion problems alluded to hereinabove. More particularly, when the amorphous silicon alloy material is deposited upon highly reflective material fabricated from aluminum, interdiffusion of the silicon and the aluminum from the contiguous layers results. Obviously the photogenerating and photoconductive properties of the body of silicon alloy material, as well as the reflective properties of the back reflector suffer.

Prior attempts at utilizing copper to fabricate the highly reflective material of the back reflector for a photoresponsive device have, likewise, proven unsatisfactory. This can be traced to the incompatibility of copper to the subsequently deposited semiconductor material fabricated from fluorinated amorphous silicon alloys. More specifically, fluorine from the body of fluorinated amorphous silicon alloy semiconductor material would react with the highly reflective copper material to form a copper:fluoride compound. As with the aluminum:silicon compound discussed in the preceding paragraph, the copper:fluoride compound deleteriously effected both the reflective properties of the copper back reflector and the photogenerative and the photoconductive properties of the semiconductor material. And as with the aluminum back reflector material described in the preceding paragraph, even when copper was sandwiched between buffer layers of titanium, or tin oxide, of a thickness specifically tailored to prevent light absorption, said buffer layers were ineffective in sufficiently preventing interdiffusion in a manner which would maintain the desired photovoltaic properties of the semiconductor material and the reflective characteristics of the back reflector.

Prior attempts to use silver as the highly reflective material from which to fabricate the back reflectors for photoresponsive devices have been unsuccessful despite the fact that the silver back reflective material presents no interdiffusion problems. However, silver and silver alloys present their own particular problem when employed as a highly reflective back reflector material, i.e., silver due to its relatively soft nature tends to easily deform, particularly during the deposition of the body of semiconductor material, thus causing a loss of any textured surface formed upon the substrate. Further, silver is expensive as compared to other back reflector materials such as for example aluminum.

Back reflectors commonly formed of the aforementioned highly reflective materials have been employed in an attempt to provide a suitable light redirecting layer for photoresponsive devices. However, as demonstrated hereinabove, each of said highly reflective materials have significant shortcomings when used as back reflector materials. It was in an attempt to alleviate such problems (primarily diffusion between elements of the highly reflective material and the body of semiconductor materials) that back reflectors formed from such highly reflective materials as aluminum, copper and silver, have been sandwiched between layers of titanium and titanium oxide, and titanium and tin oxide. However, the use of the adhesion promoting and diffusion inhibiting layers (also referred to as "buffer layers")

was not totally effective. The layers had to be very thin in order to prevent the layers from absorbing incident light. However, when made very thin, these layers could not effectively prevent interdiffusion. Alternatively, if the layers were deposited so as to prevent diffusion, they would be so thick as to absorb the incident light. It was further found that in order to increase the transparency of the buffer layer, increased series resistance was also introduced into the buffer layer, thus decreasing photoefficiency of the device. Conversely, reduced series resistance increased the amount of light reflected from the surface of the back reflector.

Peeling and cracking (adhesion failure) of the body of semiconductor material from the deposition surface of the highly reflective back reflector is believed to be due to the interdiffusion of elements at the back reflector-semiconductor material interface. The elements from which the (1) highly reflective back reflector material, (2) substrate material, and (3) semiconductor material, as described supra, are fabricated, diffuse through the respective interfaces and strain, or otherwise deleteriously effect, the chemical bonds which exist between the materials from which the contiguous layers of the aforementioned interfaces are fabricated. The resultant bond strains and recombinations cause the body of semiconductor material to crack and peel off of the underlying back reflector. And even when the aforementioned adhesion promoting and diffusion limiting layers were employed to isolate the back reflector from the substrate and the body of semiconductor material, the silver, aluminum or copper material from which the highly reflective layers are fabricated, would agglomerate, thereby substantially inhibiting, if not totally preventing, the adhesion of the subsequently deposited back reflector.

In summary, the state of the back reflector art teaches both silver and aluminum back reflectors, which are either specular or diffuse. Additionally, it is known to use a buffer layer to prevent interdiffusion between the back reflector and the overlying semiconductor device. Each of these materials, and all the combinations thereof tried to date have been inadequate for various reasons. Thus, based upon the foregoing, it should be apparent that a need existed, prior to the development of the instant invention, for the development of a highly reflective back reflector adapted for use in photoresponsive devices, the material from which the back reflector was fabricated being capable of widely diffusing incident light; be relatively inexpensive and highly reflective; and avoid the problems of inherent softness, interdiffusion and added series resistance as described hereinabove.

BRIEF SUMMARY OF THE INVENTION

There is disclosed herein a photoresponsive device which includes a substrate, a light scattering back reflector upon said substrate, and a multilayered body of semiconductor material deposited upon said back reflector. The invention is directed to an improved back reflector, which comprises a multilayered body including at least a first relatively hard, textured layer characterized by substantially micron-sized features atop said substrate and at least a second highly reflective layer conformally disposed atop said relatively hard, textured first layer. A third layer, preferably formed of a transparent oxide material may be conformally deposited upon said second highly reflective layer, which oxide layer is adapted to enhance light scattering and optical matching or coupling. In a preferred embodiment, the relatively hard, textured layer of the back reflector is preferably formed from a material selected from the group consisting essentially of aluminum, aluminum alloys, copper, copper alloys, and combinations thereof.

The second, highly reflective layer is typically formed of silver. The third layer of said multilayered back reflector is typically fabricated from a transparent oxide material, which may be doped to improve the electrical conductivity thereof and is formed from a material selected from the group consisting essentially of zinc oxide, tin oxide, indium oxide, indium tin oxide, cadmium stannate, and combinations thereof. It is important to note that the transparent oxide material can be deposited either by conventional magnetron sputtering techniques or alternatively, by a chemical spray pyrolysis technique such as that disclosed in commonly assigned, co-pending U.S. patent application Ser. No. 264,579 filed Oct. 26, 1988, in the names of Banerjee, et al, the disclosure of which is incorporated herein by reference.

In one embodiment, the multilayered back reflector includes a relatively hard, textured, layer formed of aluminum; a second highly reflective silver layer conformally disposed upon said first layer; and a third zinc oxide layer disposed upon said second layer to enhance optical coupling. The first relatively hard, textured layer is typically formed to a thickness of approximately 1500 to 3000 Angstroms. The second, highly reflective layer is typically deposited to a thickness of approximately 200 to 500 Angstroms; and the third, transparent oxide layer is typically deposited to a thickness of approximately 1000 to 5000 Angstroms. It is to be appreciated that by using less of the expensive, highly reflective material such as silver, and a harder, yet more easily textured material such as aluminum or an aluminum alloy as the first layer, one may achieve the benefits inherent in both materials while achieving significant economic savings.

The photoresponsive device is preferably a photovoltaic device which includes a substrate that may be either electrically conductive, or electrically insulating and includes an electrically conductive electrode disposed thereover. Typically, the photovoltaic device includes at least one and preferably two or more stacked p-i-n type photovoltaic cells formed of silicon alloy material; each cell successively deposited upon the multilayered back reflector of the instant invention.

Also disclosed in the instant patent application is a process for the fabrication of a photoresponsive device which includes a substrate, a light scattering back reflector upon said substrate, and a multilayered body of semiconductor material upon said back reflector. The process includes the steps of forming said back reflector as a multilayered body comprising a first relatively hard, textured layer upon the substrate; a second highly reflective layer conformally disposed atop the relatively hard, textured first layer; and a third layer conformally disposed atop said second layer. The third layer is typically a layer of transparent oxide material adapted to enhance optical coupling and the light scattering characteristics of the underlying layers. The process of the instant invention utilizes the materials disclosed with regard to the device described hereinabove.

DETAILED DESCRIPTION OF THE DRAWINGS

I. The Photovoltaic Device

Figure 1:
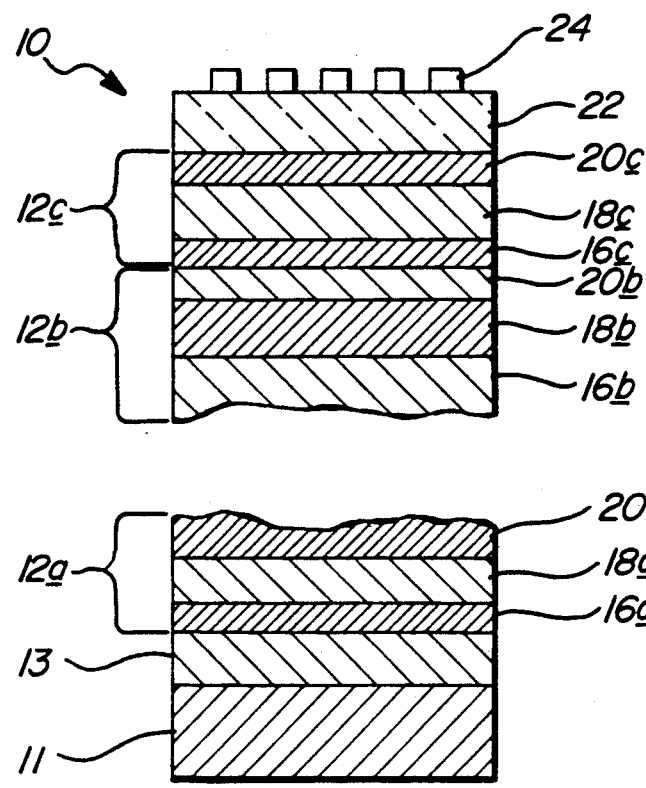
FIG. 1 is a fragmentary cross-sectional view of a stacked photovoltaic device, said device comprising a plurality of n-i-p type photovoltaic cells.

Referring now to the drawings, and particularly to FIG. 1, there is illustrated a photovoltaic device 10 formed from a plurality of successively deposited p-i-n layers of semiconductor alloy material. As will be described in detail hereinafter, the photovoltaic device 10 illustrated in FIG. 1 includes the highly reflective, light scattering back reflector of the instant invention.

More particularly, FIG. 1. shows a p-i-n type photovoltaic device such as a stacked series of solar cells comprising three individual p-i-n type cells 12a, 12b and 12c. At the bottom of the stacked photovoltaic device is a substrate 11 which functions as the bottom electrode and which may be either transparent or formed from a metallic material such as stainless steel, mild steel, aluminum, tantalum, molybdenum or chromium. Although certain applications may require a tin oxide layer and/or a series of base contacts prior to the deposition of the semiconductor alloy material, for purposes of this application the term "substrate" shall include not only the flexible support film, but also any other elements added thereto by preliminary processing.

Between the lowermost cell 12a and the substrate 11 is the highly reflective, light scattering, back reflector 13 of the instant invention. As discussed hereinabove, the back reflector 13 is a multilayered body comprising two or more operatively functional layers. While FIG. 1 shows the back reflector 13 as a single body, it is to be appreciated that FIG. 2, discussed in detail hereinbelow, specifically describes the composition and function of each component layer.

Each of the discrete overlying cells 12a, 12b and 12c is fabricated with an amorphous semiconductor body containing at least a silicon or germanium alloy. Each of the amorphous semiconductor bodies preferably includes a p-type conductivity semiconductor layer 20a, 20b and 20c; an intrinsic semiconductor layer 18a, 18b and 18c; and an n-type conductivity layer 16a, 16b and 16c. As illustrated, cell 12b is an intermediate cell and as indicated in FIG. 1, additional intermediate cells may be stacked atop the illustrated cells without departing from the spirit or scope of the present invention.

It is to be understood that following the deposition of the semiconductor body, a further deposition process may be either performed in a separate environment or as part of a continuous process. It is in this step that a transparent conductive oxide layer 22 is formed, in a preferred embodiment, of a transparent, electrically conductive, wide band gap oxide material, such as indium tin oxide or zinc oxide, also referred to herein as the top electrode, is deposited atop the body of semiconductor alloy material. An electrode grid 24 may be applied atop the photovoltaic device when the individual cells thereof are of especially large area, or when the conductivity of the transparent conductive oxide layer 22 is insufficient to adequately collect photogenerated current. Note that care must be taken to (1) fabricate the transparent oxide material of the desired conductivity by selecting the appropriate degree of oxygen deficiency; and (2) fabricate said transparent oxide material at a sufficiently low deposition temperature that the electrical and optical performance of the body of semiconductor alloy material is not deleteriously effected.

While the device illustrated in FIG. 1 is a stacked assembly of discrete solar cells, the instant invention may also be employed with other cell arrangements such as a single p-i-n cell, stacked or single n-i-p cell, p-i-n Schottky barrier cells and the like. The body of semiconductor material can include amorphous silicon alloys, amorphous germanium alloys, gallium arsenide, cadmium sulfide, copper indium diselenide, etc. Accordingly, in the description and the claims which follow, the layers of semiconductor alloy material disposed between the substrate 11 and the upper electrode will be referred to as the "body of semiconductor material," said term intended to include combinations of layers of semiconductor alloy material of specific photoconductive properties which are adapted to provide for a flow of photogenerated electrical current when appropriately combined with one or more electrodes. This flow of electrode current is specifically defined to include current switching operations which can be accomplished by photodiodes and photoresistors, as well as the photogeneration of and a collection of charge carrier paris accomplished by photovoltaic devices.

It is to be noted that the solar cell described hereinabove was formed on an opaque substrate such as stainless steel. However, the novel back reflector structure and process for the fabrication thereof of the instant invention is equally adaptable for solar cells formed on transparent substrates such as glass or a transparent polymer. The fabrication of solar cells on either transparent or opaque substrates represent reverse processes wherein either the back reflective layers or the upper electrode is first deposited. When transparent substrates are employed, the substrate becomes the light incident surface; conversely, when opaque substrates are employed, the substrate becomes the light reflective surface. In either event, it becomes necessary to deposit a transparent conductive oxide atop the body of semiconductor alloy material; with opaque substrates, as a top electrode and with transparent substrates, as the buffer layer.

Figure 2:
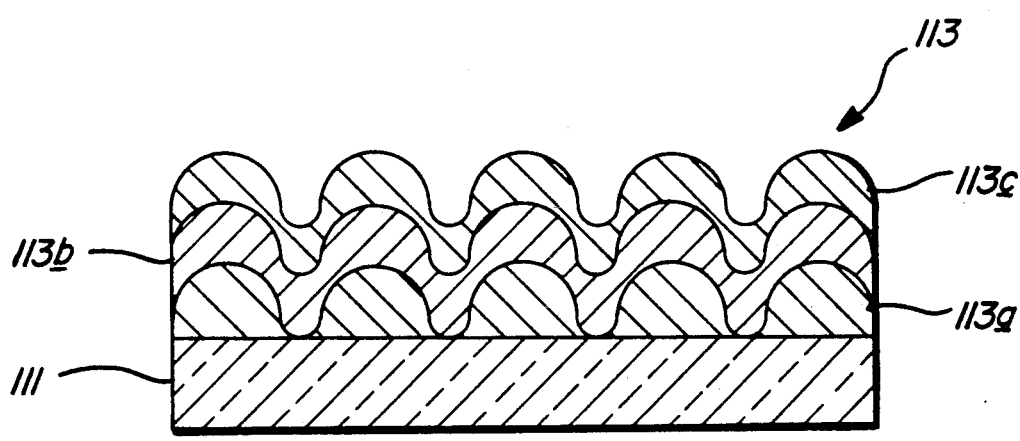
FIG. 2 is a cross-sectional view of the multilayered back reflector of the instant invention, upon which back reflector the stacked photovoltaic device of FIG. 1 is deposited.

Turning now to FIG. 2, there is illustrated a cross-sectional view of the multilayered back reflector 113 of the instant invention. Specifically, the back reflector 113 is deposited upon a substrate 111, which substrate is structured in the manner described hereinabove. The back reflector 113 is formed as a multilayered body. Disposed directly upon the upper surface of the substrate 111 is a first layer 113a which is specially processed to define a textured surface, having either submicron or micron scale features adapted to promote the random scattering of photons of light incident thereon. This first layer is preferably formed of a relatively hard material which is also relatively inexpensive (as compared to, for example silver) and readily disposed upon said substrate so as to provide a textured surface. Texturing of layer 113a may be accomplished either by the deposition process itself, or by a mechanical process performed upon the layer. It is noteworthy that the assignee of the instant invention fabricates tandem photovoltaic cells in a continuous manner on a web of substrate material. It therefore is an important attribute of any back reflector that the layers thereof are capable of being applied with high yields, on a roll-to-roll basis. Preferred materials for said first relatively hard, textured layer include aluminum, aluminum alloys, copper, copper alloys and combinations thereof.

The back reflector 113 further includes a second highly reflective layer 113b conformally disposed upon said first, relatively hard, textured layer 113a. The second layer 113b is typically fabricated of a material which has a higher index of integrated reflectivity than the first layer 113a. Therefore, said second layer is limited to a relatively few materials; typically silver. The highly reflective layer 113b is conformally disposed upon the textured surface of the first layer 113a so as to maximize the amount of reflected light randomly scattered. Said second layer 113b is typically about 50 to 1000 Angstroms thick and preferably 100 to 500 Angstroms thick. It may thus be appreciated that this second layer 113b contributes the highly light reflecting properties of silver, while avoiding the inherent shortcomings of silver presented hereinabove; namely, the (1) expense associated with providing a thick silver layer, and (2) yield problems arising from silver's inherent softness.

The back reflector 113 may further and preferably does include a third layer 113c disposed upon the exposed surface of said second highly reflective layer 113b. The third layer 113c is conformally deposited to a thickness of approximately 500-2500 Angstroms, and is adapted to: (1) enhance the scattering of incident photons provided by the textured first layer; (2) provide optical coupling between the body of semiconductor material and the underlying layers of the back reflector; (3) provide a buffer or barrier layer to prevent elemental interdiffusion at the interface between the body of semiconductor material and the underlying layers of the back reflector. The buffer layer 113c is typically fabricated from a wide band gap (transparent) oxide material, which may be appropriately doped so as to be an electrically conductive transparent oxide material. This transparent oxide material is typically selected from the group consisting essentially of zinc oxide, indium oxide, tin oxide, indium tin oxide, cadmium stannat, and combinations thereof.

As may be further appreciated from FIG. 2, since the layers 113b and 113c are conformally disposed upon the textured layer 113a, said layers at least substantially retain the shape and size of the micron-scale features of the relatively hard, textured layer 113a. This shape and size is propagated through the overlying layers of the body of semiconductor material, and in fact is beneficial to the photoconversion efficiency of the photovoltaic device. This is due to the fact that the superjacent intrinsic layers of amorphous semiconductor alloy material appear thinner to photogenerated charge carriers. By this, it is meant that due to the shape of these layers of semiconductor alloy material as well as due to the effectiveness of the light reflecting properties of the back reflector, charge carriers photogenerated int he bulk of the intrinsic layer migrate through a thinner intrinsic later to be collected. This is because (1) there is more surface area of the intrinsic layer to which a migrate and (2) the intrinsic layer is made thinner due to more effective back reflection. As a result, there is less chance for recombination of those charge carries, and therefore greater photoconversion efficiency of the device.

The Fabrication Process

The layers of silicon alloy material of the photovoltaic device illustrated in FIG. 1 can be continuously fabricated by employing the teaching disclosed in the aforementioned U.S. patents. These continuous fabrication techniques can then be employed in conjunction with the continuous process set out hereinbelow to economically and efficiently produce a photovoltaic device which includes the multilayered, light scattering back reflector of the instant invention.

In the preferred embodiment, the first, relatively hard, textured layer comprising, for example, aluminum, or an aluminum alloy can be deposited onto an elongated web of substrate material utilizing conventional magnetron sputtering apparatus. When employed with the elongated web of substrate material, the magnetron sputtering apparatus provides for the deposition of the first, relatively hard, textured layer in a roll to roll assembly line process. This assembly line process is significant because the deposition of the body of semiconductor material, itself, is accomplished in a continuous, roll-to-roll process. It is therefore possible to automate the entire production of an amorphous photoresponsive device from the point of entry of the elongated web of substrate material, to the deposition of the multilayered body of semiconductor material thereunto, and through the deposition of the multilayered highly reflective back reflector thereunto.

When employing the aforementioned magnetron sputtering apparatus, argon gas is pumped into the deposition chamber through which the web of substrate material is continuously moved. The aluminum or other compositionally preferred sputtering target, is operatively disposed in close proximity to the moving web of substrate material. When energized, atomic fragments of the aluminum target are ejected from the target by the impact of argon gas ions, said particles directed toward and deposited onto the web. Since the target is formed as a uniform aluminum alloy through the bulk thereof, a uniform layer of highly textured material is depositioned upon the entire exposed surface area of the web of substrate material continuously passing through the deposition chamber.

In operation, the pressure within the chamber is about 3 millitorr, while the flow rate of the argon gas is maintained at about 200 SCCM and the temperature maintained within the chamber is about 400°-500° Centigrade. Approximately 2.5-3.0 kilowatts of power, 400-500 volts and 6 amps, are employed over two targets to energize argon ions to eject the aluminum particles from the target, deliver the particles to the web of substrate material and deposite the particles on the web. The rate of deposition is about 80 to 100 Angstroms per second, and the web of substrate material passes through the deposition chamber at a speed of approximately 2 feet per minute so as to deposit a thickness of approximately 500 to 5000 and preferably 1000 to 3000 Angstroms of the aluminum material thereunto.

Thereafter, the elongated web of substrate material having a textured layer of micro-scale featured material deposited thereupon, passes into a second, conventional magnetron sputtering unit adapted to deposit the second highly reflective layer thereonto. This second sputtering chamber functions in the same manner as the unit described hereinabove. The sputtering target, such as silver, is operatively disposed in close proximity to the web of substrate material, and the interior of said chamber is flooded with argon.

In operation, the presure within the silver sputtering chamber is about 3 millitorr, while the flow rate of argon gas is maintained at about 200 SCCM and the temperature maintained within the chamber is maintained at about 400°-500° Centrigrade. Approximately 0.15-2.5 kilowatts of power, 300 to 500 volts and 0.5 to 5.0 amps are employed to energize the argon to eject silver particles from the target and deposite same onto the moving web of substrate material. Since the rate of deposition of about 10 Angstroms per second, the web of substrate material passes through the deposition chamber at a speed of approximately 4 feet per minute, so as to deposit a thickness of approximately 100 to 1000 and preferably 200-500 Angstroms of silver thereupon.

The third layer of transparent oxide material may also be deposited upon the web of substrate material by magnetron sputtering, employing, for example, a zinc oxide target in the deposition chamber. Alternatively, a uniform layer of zinc oxide, or other transparent oxide material may be deposited by a chemical spray pyrolysis technique such as that disclosed in the aforementioned commonly assigned, co-pending U.S. patent application. Finally, as is well known in the art, the degree of electrical conductivity of the transparent oxide may be controlled by either controlling the oxygen deficiency thereof or by appropriately doping the material.

The foregoing description and examples are meant to be merely illustrative of the utility of the instant invention, and are not intended as a limitation thereupon. It is the claims which follow, including all equivalents, which are intended to define the scope of the instant invention.

We claim:

1. In a photoresponsive device, which device includes a substrate, a light scattering back reflector atop said substrate, and a multilayered body of semiconductor material atop said back reflector, the improvement comprising, in combination:

said back reflector comprising a tri-layered body including a hard, textured, non-highly reflective layer formed of a material other than copper, aluminum or silver and disposed directly upon said substrate, said textured layer having substantially micro-sized features; a highly reflective layer conformally disposed atop said textured layer; and a transparent oxide layer deposited upon said highly reflective layer, said oxide layer adapted to enhance light scattering and optical coupling.

2. A device as in claim 1, wherein said third transparent oxide layer is an electrically conductive transparent oxide material.

3. A device as in claim 1, wherein said relatively hard, textured layer is formed of a material selected from the group consisting essentially of aluminum, aluminum alloys, copper, copper alloys, and combinations thereof.

4. A device as in claim 1, wherein said reflective layer is formed of silver.

5. A device as in claim 2, wherein said transparent oxide layer is formed of a material selected from the group consisting essentially of zinc oxide, tin oxide, indium oxide, indium tin oxide, cadmium stannate, and combination thereof.

6. A device as in claim 1, wherein said hard, textured layer is approximately 1500-3000 Angstroms thick.

7. A device as in claim 1, wherein said reflective layer is approximately 200-500 Angstroms thick.

8. A device as in claim 1, wherein aid transparent oxide layer is approximately 1000-5000 Angstroms thick.

9. A device as in claim 1, wherein said photoresponsive device is a photovoltaic device including at least one p-i-n type cell formed of amorphous silicon alloy material.

10. A device as in claim 1, wherein said substrate is electrically conductive and formed from a material selected from the group consisting essentially of stainless steel, nickel, aluminum, and combinations thereof.

11. A device as in claim 1, wherein said substrate is electrically insulating and further includes an electrically conductive layer operatively disposed between said substrate and said back reflector; said insulating substrate formed of a material selected from the group consisting essentially of polyimide, glass and combinations thereof.

12. A device as in claim 1, wherein the texturing of said relatively hard, textured layer is formed by mechanical means.

* * * * *